United States Patent
Watanabe et al.

(10) Patent No.: US 12,167,565 B2
(45) Date of Patent: Dec. 10, 2024

(54) IMAGE CAPTURING APPARATUS

(71) Applicant: CANON KABUSHIKI KAISHA, Tokyo (JP)

(72) Inventors: Kentaro Watanabe, Tokyo (JP); Kenji Ishii, Kanagawa (JP); Takashi Yoshida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 18/048,813

(22) Filed: Oct. 21, 2022

(65) Prior Publication Data

US 2023/0164945 A1 May 25, 2023

(30) Foreign Application Priority Data

Nov. 25, 2021 (JP) .................................. 2021-191535

(51) Int. Cl.
*H05K 7/20* (2006.01)

(52) U.S. Cl.
CPC ..... *H05K 7/20145* (2013.01); *H05K 7/20154* (2013.01)

(58) Field of Classification Search
CPC ........ H04N 23/54; H04N 23/55; H04N 23/51; H04N 23/50; H05K 1/028; H05K 1/0286; H05K 1/147; H05K 1/181; H05K 1/14; H05K 1/148; H05K 2201/10151; G02B 7/023; G02B 7/003; G03B 5/00
See application file for complete search history.

(56) References Cited

U.S. PATENT DOCUMENTS

| | | | | |
|---|---|---|---|---|
| 2009/0002549 A1* | 1/2009 | Kobayashi | .............. | H04N 23/52 348/374 |
| 2014/0055671 A1* | 2/2014 | Kawamura | .............. | H04N 5/64 348/374 |
| 2023/0247294 A1* | 8/2023 | Okamori | ................ | G03B 17/26 348/208.99 |
| 2023/0353850 A1* | 11/2023 | Endo | .................... | H04N 23/687 |
| 2023/0379561 A1* | 11/2023 | Nakamura | ........... | H04N 23/687 |

FOREIGN PATENT DOCUMENTS

JP 2020030393 A 2/2020

* cited by examiner

*Primary Examiner* — Mandeep S Buttar
(74) *Attorney, Agent, or Firm* — Canon U.S.A., Inc. IP Division

(57) ABSTRACT

An image capturing apparatus includes an image capturing element, a first circuit board to mount the image capturing element on the first circuit board, a second circuit board facing the first circuit board, a fan, and a first flexible board electrically connect the first circuit board and the second circuit board. The image capturing element moves within a movable range in a direction different from an optical axis direction. The first flexible board is bent in an area that overlaps with the movable range of the image capturing element in the optical axis direction. When viewed from a direction orthogonal to an optical axis, an orientation of an exhaust opening of the fan is arranged toward an inner surface of a bending portion of the first flexible board closest to the first circuit board at a center position of the movable range of the image capturing element.

9 Claims, 10 Drawing Sheets

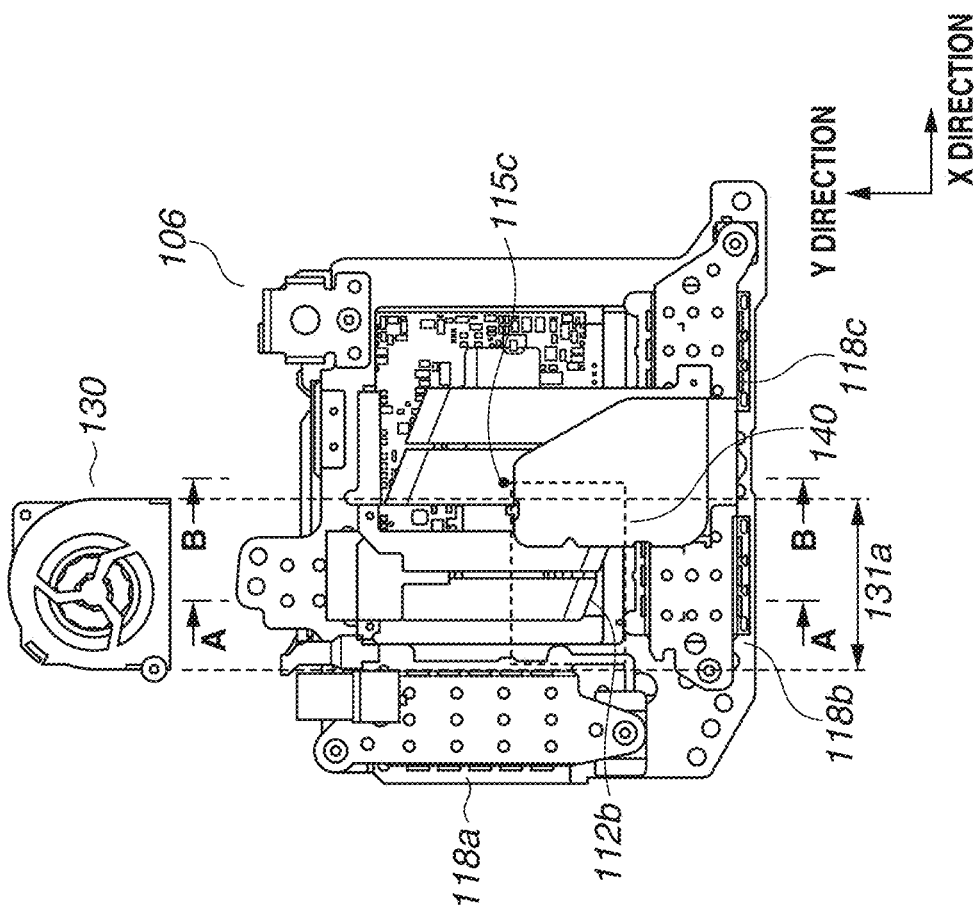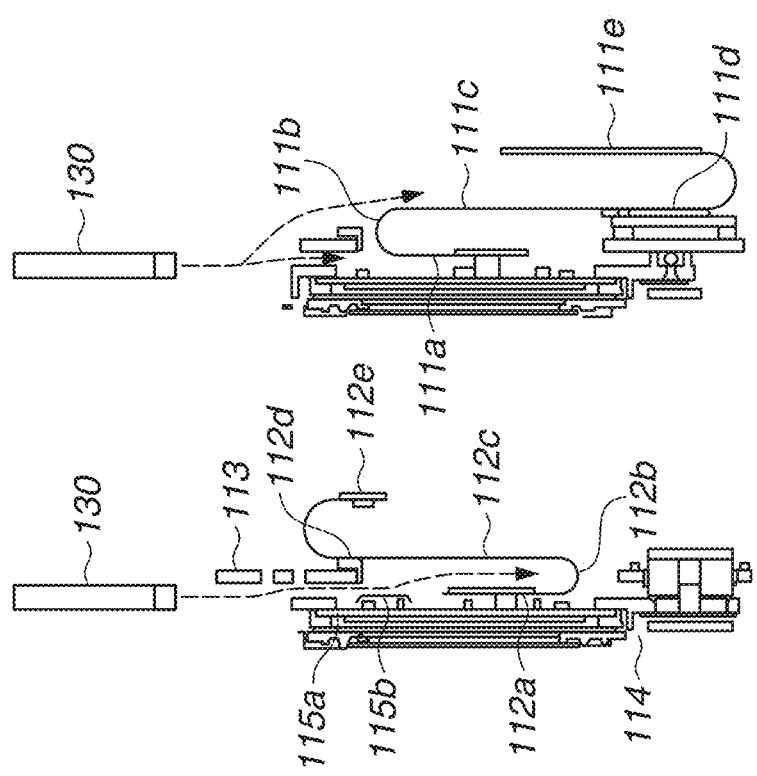

C-C CROSS-SECTIONAL VIEW

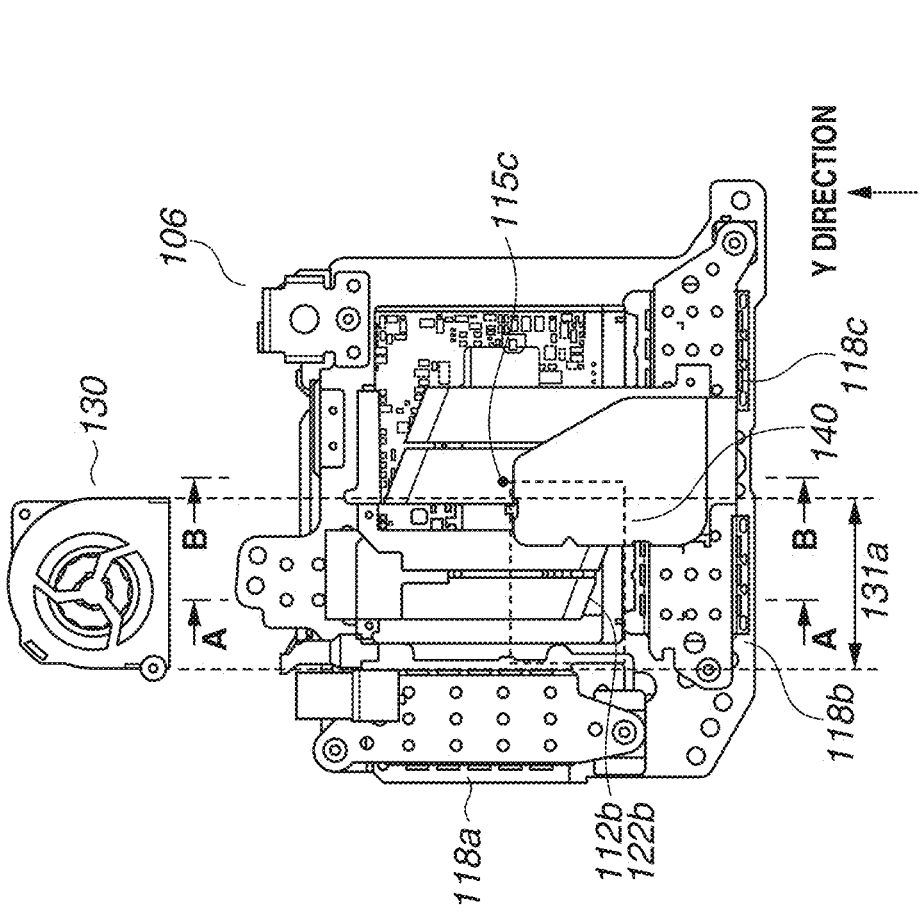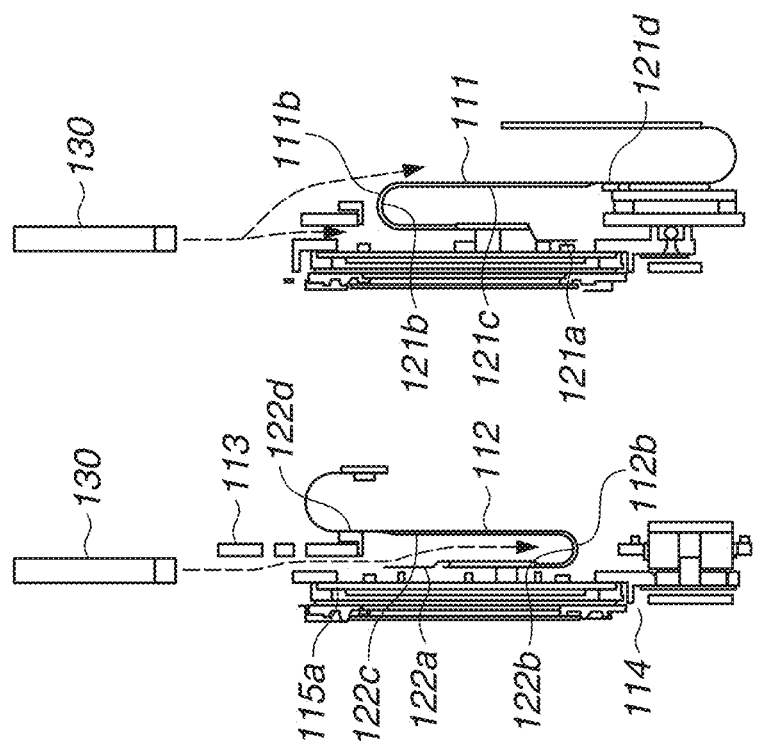

IMAGE CAPTURING APPARATUS

BACKGROUND

Field

The present disclosure relates to an image capturing apparatus that includes a heat dissipation structure for heat generated from a heat generating source.

Description of the Related Art

Recently, miniaturization and high density of components mounted inside electronic devices have become remarkable along with a demand for miniaturization of the devices.

Meanwhile, a demand for higher functionality of image capturing apparatuses, particularly higher performance of moving image functions, is increasing, and amounts of heat generated by those apparatuses tend to increase.

In a case where a moving image is captured in a high temperature environment, there is a high possibility that a rise in temperature inside an image capturing apparatus will cause mounted components to malfunction or deteriorate in performance, and eventually cause the image capturing apparatus to break down.

Thus, in a case where a heat dissipation amount by natural heat dissipation is not sufficient with respect to a heat generation amount of an image capturing apparatus, a heat dissipation structure that uses forced air cooling by a fan and a thermal conduction member is used.

Japanese Patent Application Laid-Open No. 2020-030393 discusses an apparatus that cools a movable image capturing element by connecting it to a thermal conduction member.

Recently, an image capturing apparatus that performs shake correction by moving an image capturing element in a direction orthogonal to an optical axis direction has become widely used in order to improve image quality.

The image capturing apparatus that performs the above-described shake correction is also required to have sufficient heat dissipation performance since the heat generated by the image capturing element may affect the image quality at the time of driving a shake correction mechanism and the time of continuous imaging and the time of moving image capturing.

However, in the apparatus discussed in the above-described Japanese Patent Application Laid-Open No. 2020-030393, the thermal conduction member is physically connected to the movable image capturing element and thus hinders an operation of the image capturing element.

SUMMARY

An exemplary embodiment of the present disclosure is directed to the provision of an image capturing apparatus that satisfies heat dissipation performance without hindering a movable image capturing element.

According to an aspect of the present disclosure, an image capturing apparatus includes an image capturing element configured to move within a movable range in a direction different from an optical axis direction, a first circuit board configured to mount the image capturing element on the first circuit board, a second circuit board configured to face the first circuit board, a first flexible board configured to electrically connect the first circuit board and the second circuit board, and a fan, wherein the first flexible board is bent in an area that overlaps with the movable range of the image capturing element in the optical axis direction, and wherein, in a case of being viewed from a direction orthogonal to an optical axis, an orientation of an exhaust opening of the fan is arranged toward an inner surface of a bending portion of the first flexible board closest to the first circuit board at a center position of the movable range of the image capturing element.

Further features of the present disclosure will become apparent from the following description of exemplary embodiments with reference to the attached drawings.

BRIEF DESCRIPTION OF THE DRAWINGS

FIGS. 5A, 5B, and 5C, respectively, are an A-A cross-sectional view, a B-B cross-sectional view, and a rear view of the image capturing element unit and the heat dissipation fan according to the first exemplary embodiment of the present disclosure.

FIGS. 9A, 9B, and 9C, respectively, are an A-A cross-sectional view, a B-B cross-sectional view, and a rear view of the image capturing element unit and the heat dissipation fan according to the second exemplary embodiment of the present disclosure.

DESCRIPTION OF THE EMBODIMENTS

Figure 1:
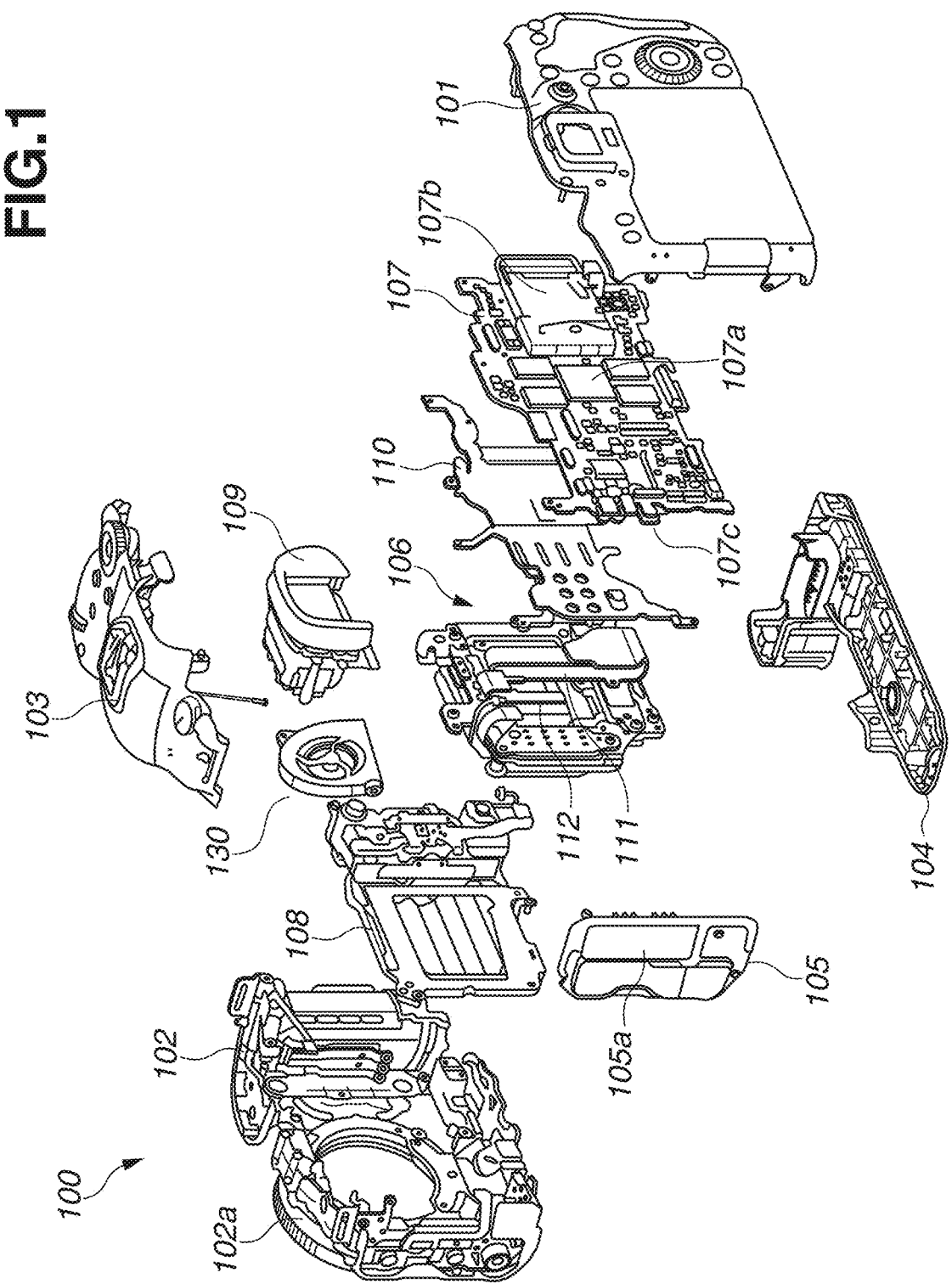
FIG. 1 illustrates a digital camera according to the present disclosure.

Exemplary embodiments of a technique according to the present disclosure will be described in detail below with reference to the attached drawings.

However, components described below can be appropriately modified in their dimensions, materials, shapes, and relative layout considering configurations and various conditions of an apparatus to which the present disclosure is applied.

Thus, the exemplary embodiments described below are not intended to limit the scope of the present disclosure thereto.

Well-known techniques or publicly known technologies in the relevant technical field can be applied to a configuration and a process that are not particularly illustrated or described. In addition, redundant descriptions may be omitted.

In the drawings, the same or functionally similar elements are denoted by the same reference numerals. In FIG. 5, an optical axis direction, a longitudinal direction, and a transverse direction, respectively, are defined as a Z direction, an X direction, and a Y direction.

(Rear Exploded Perspective View of Digital Camera 100)

FIG. 1 is a rear exploded perspective view of a digital camera 100 as an image capturing apparatus according to the present disclosure.

As illustrated in FIG. 1, the digital camera 100 includes a mount unit 102a, a rear cover 101, a front base 102, a top cover 103, a bottom cover 104, and the side cover 105.

An image capturing element unit 106 that includes an image shake correction mechanism, a main board (also referred to as a second circuit board) 107, a shutter 108, a finder 109, and a chassis 110 are arranged inside the digital camera 100.

The image capturing element unit 106 is configured with a movable unit that includes an image capturing element 115 and a fixed unit and is arranged perpendicular to an optical axis.

The front base 102 is formed of, for example, a magnesium die cast or a resin and includes the mount unit 102a for mounting an interchangeable lens.

The main board 107 is configured with a multi-layer substrate, and electronic components are mounted on both sides thereof. The main board 107 is fixed to the front base 102 and the metal chassis 110 with screws.

On the main board 107, a control integrated circuit (IC) 107a for controlling an image capturing signal, a connector 107b for a storage medium for storing an external storage medium, and an external communication terminal 107c for connecting a connection cable to an external apparatus are mounted.

The external communication terminal 107c is covered with a terminal cover 105a.

The image capturing element unit 106 is a member which consumes particularly large power and generates a large amount of heat and of which temperature rise is sharp in the digital camera 100.

A possible image capturing time length of the digital camera 100 is limited by an operation guarantee temperature of each member. In order to ensure the possible image capturing time length as long as possible, it is necessary to take a measure to release the heat of the image capturing element unit 106, which is a heat generating source, so that the temperature does not exceed the operation guarantee temperature.

The image capturing element unit 106 is fixed to the front base 102 with the screws, and the heat of the image capturing element unit 106 is released to the front base 102.

A heat dissipation fan 130 is arranged near the image capturing element unit 106 with its blowing direction perpendicular to the optical axis. A wind passes through a rear surface of the image capturing element unit 106, which is the heat generating source, and prevents the image capturing element unit 106 from becoming locally hot (details will be described below).

According to the present exemplary embodiment, a centrifugal fan is used as the heat dissipation fan 130 as a blowing unit. However, the fan is not limited to this one and, for example, an axial flow fan or the like can be used as long as the purpose can be achieved.

Further, according to the present exemplary embodiment, the blowing direction of the heat dissipation fan 130 is arranged perpendicular to the optical axis. However, the arrangement is not limited to this one as long as the airflow from the heat dissipation fan 130 directly hits the image capturing element unit 106, and the heat dissipation fan 130 may be arranged so that the blowing direction is not perpendicular to the optical axis.

The main board 107 is also one of the heat generating sources, and a heat dissipation effect can be provided to a plurality of the heat generating sources by arranging an exhaust opening 131 of the heat dissipation fan 130 so that the air is blown between the image capturing element unit 106 and the main board 107.

However, the image capturing element unit 106 including a movable unit 114 has few heat dissipation routes, so that it is advantageous for heat dissipation to arrange the exhaust opening 131 of the heat dissipation fan 130 at a position closer to the image capturing element unit 106 than to the main board 107.

(Description of Image Capturing Element Unit 106)

Figure 2A:
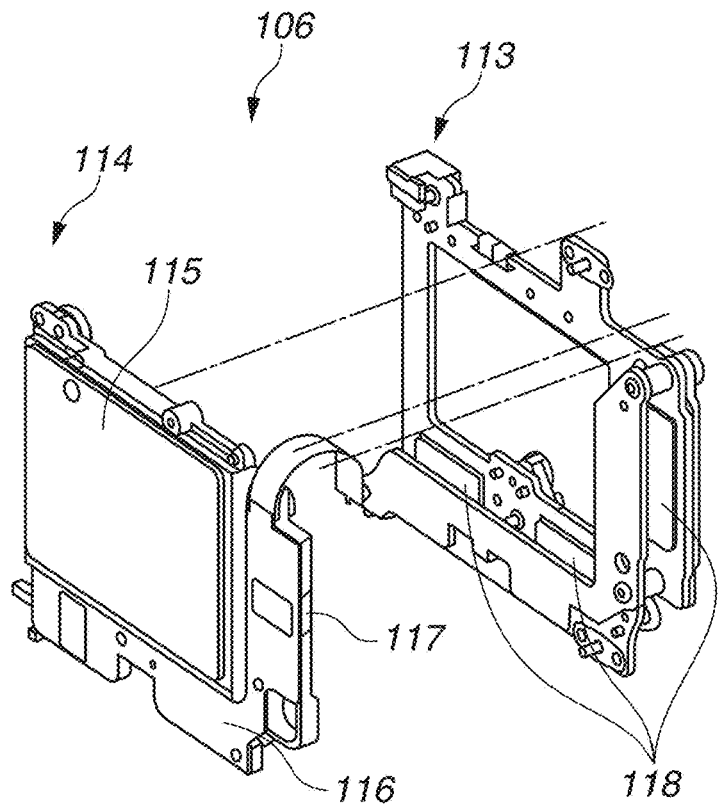
FIGS. 2A and 2B, respectively, are a front exploded perspective view and a rear exploded perspective view of an image capturing element unit according to the present disclosure.
Figure 2B:
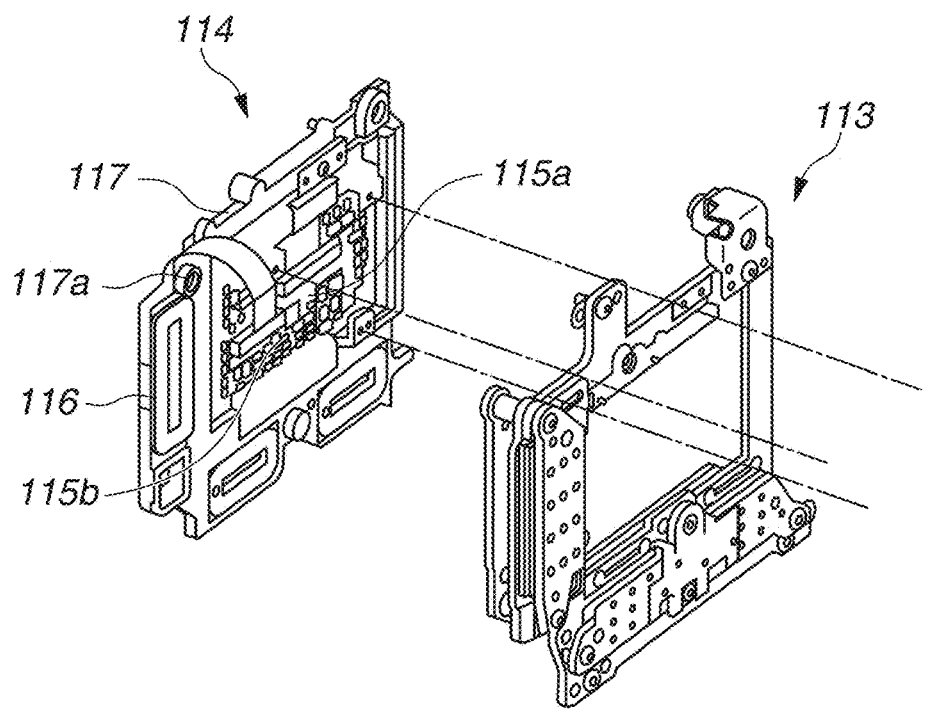

The image capturing element unit 106 is described in detail with reference to FIGS. 2A and 2B. FIGS. 2A and 2B, respectively, are a front exploded perspective view and a rear exploded perspective view of the image capturing element unit 106.

The movable unit 114 includes a coil unit 116 in which a coil and a Hall element for moving the image capturing element 115 are arranged and is held by a sensor holder 117.

Three magnets 118 are held on a drive mechanism 113 side, and the movable unit 114 is attracted and held by the magnets 118.

A ball (not illustrated) is included in a ball holding unit 117a provided to the sensor holder 117 between the movable unit 114 and the drive mechanism 113.

The movable unit 114 can be moved by changing an amount of energization to the coil unit 116.

Hand shake correction can be applied by moving the movable unit 114 in a direction of cancelling a shake of a main body of the digital camera 100.

In the image capturing element 115, a sensor chip (not illustrated) is bonded to an image capturing board (also referred to as a first circuit board) 115a on which an image capturing circuit is mounted and is electrically connected to the image capturing board 115a by wire bonding.

The image capturing element 115 and the sensor holder 117 are bonded and fixed to each other with an adhesive.

Elements 115b such as a capacitor, a resistor, and a regulator of the image capturing circuit are mounted on a rear surface of a sensor chip attachment surface of the image capturing board 115a.

The image capturing element unit 106 and the main board 107 are electrically connected to each other using a flexible wiring board.

An image capturing signal flexible board (also referred to as a second flexible board) 111 is provided with wiring for an image capturing signal output from the image capturing element 115 and for a control signal necessary for driving the image capturing element 115, and the signals are transmitted to the control IC 107a on the main board 107.

An image capturing power supply flexible board (also referred to as a first flexible board) 112 is a flexible board that supplies power for driving the image capturing element 115. An inter-board connector is used for connecting the image capturing board 115a and each flexible board.

(Rear View and Schematic Diagram of Heat Dissipation Fan 130 and Image Capturing Element Unit 106)

Figure 3A:
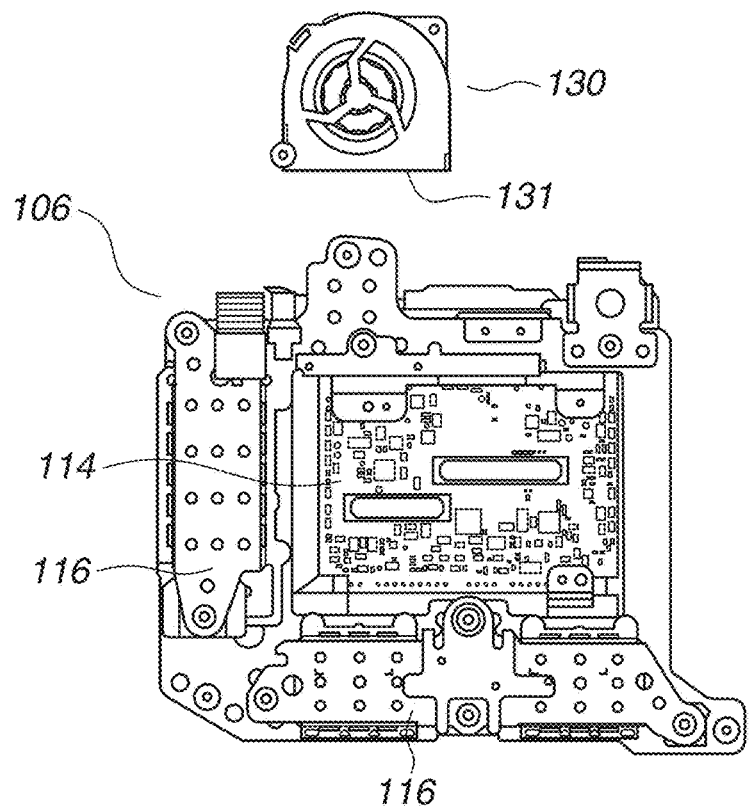
FIGS. 3A and 3B, respectively, are a rear view and a schematic rear view of the image capturing element unit and a heat dissipation fan according to the present disclosure.
Figure 3B:
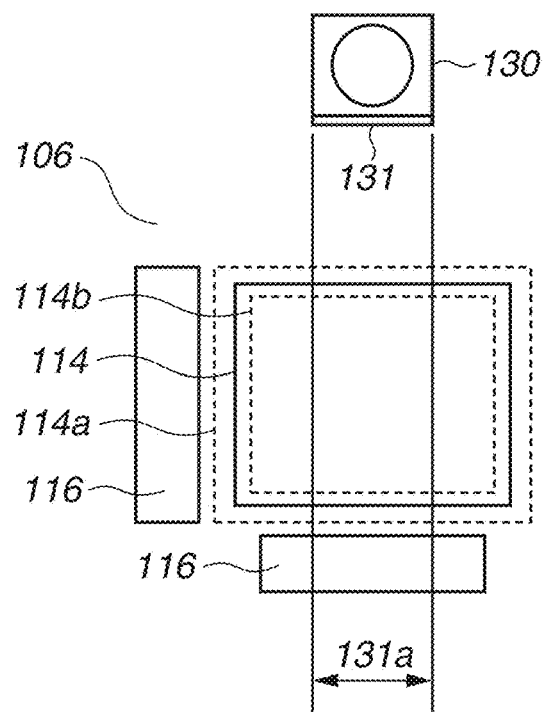

FIGS. 3A and 3B, respectively, are a rear view and a schematic diagram of the heat dissipation fan 130 and the image capturing element unit 106.

Movement of the movable unit 114 of the image capturing element unit 106 and a positional relationship with respect to the heat dissipation fan 130 are described.

The movable unit 114 can move perpendicular to the optical axis in a movement range 114a illustrated in FIG. 3B. Further, in a case where the movable unit 114 moves, the movable unit 114 always exists in a range 114b.

The range 114b is a range in which the movable unit 114 exists even if the movable unit 114 moves to any position in the movement range 114a.

Next, arrangement of the heat dissipation fan 130 will be described. As described above, the heat dissipation fan 130 blows air so that the air passes through the rear surface of the image capturing element unit 106.

The exhaust opening 131 of the heat dissipation fan 130 is oriented so that the air is blown to the range 114b in which the movable unit 114 always exists if the movable unit 114 moves.

An outline of a blowing direction 131a is indicated in FIG. 3B. Since the blowing direction 131a is within the range 114a, the heat dissipation effect can be achieved regardless of a position of the movable unit 114, which is the heat generating source of the image capturing element unit 106.

Further, the heat dissipation fan 130 is not physically connected to the movable unit 114, so that the heat dissipation effect can be produced without impairing a hand shake correction function by the movement. A center position of the movable unit 114 matches the optical axis.

The airflow is exhausted from the exhaust opening 131 of the heat dissipation fan 130 in the transverse direction of the image capturing element 115.

(Positional Relationship Among Image Capturing Signal Flexible Board 111, Image Capturing Power Supply Flexible Board 112, and Heat Dissipation Fan 130)

A positional relationship among the image capturing signal flexible board 111, the image capturing power supply flexible board 112, and the heat dissipation fan 130 is described in detail with reference to FIGS. 4 and 5A to 5C.

Figure 4:
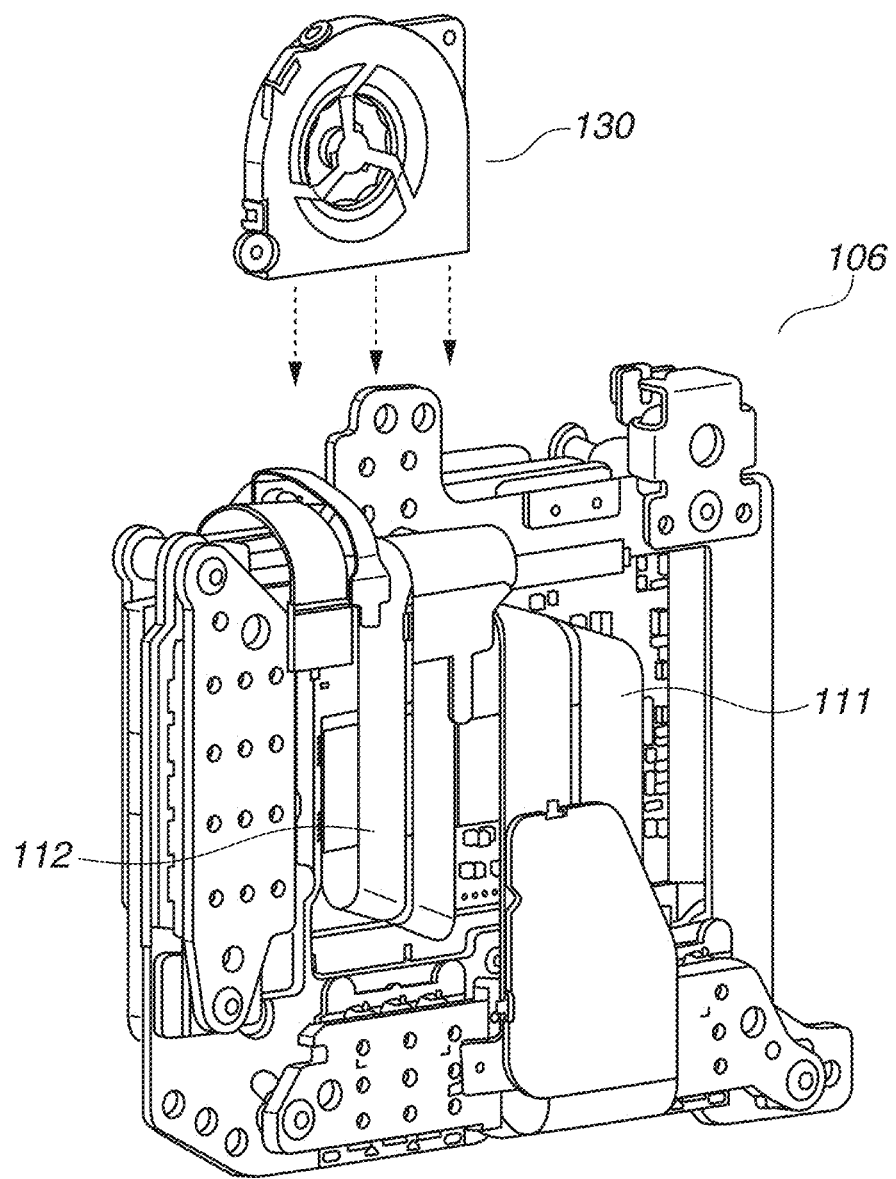
FIG. 4 is a rear perspective view of an image capturing element unit and a heat dissipation fan according to a first exemplary embodiment of the present disclosure.

FIG. 4 illustrates the image capturing element unit 106 and the heat dissipation fan 130 viewed obliquely from the rear side of the digital camera 100.

As illustrated in FIG. 4, the image capturing power supply flexible board 112 and the image capturing signal flexible board 111 are provided so as to fixed to the movable unit 114 and the drive mechanism 113 in the image capturing element unit 106.

FIG. 5C is a rear view of the image capturing element unit 106, and FIGS. 5A and 5B, respectively, are an A-A cross-sectional view and a B-B cross-sectional view of FIG. 5C.

As illustrated in FIG. 5A, the image capturing power supply flexible board 112 is connected to a connector mounted on a surface on which the element 115b of the image capturing board 115a is mounted and has a first end portion 112a that is arranged in a direction substantially parallel to the image capturing board 115a.

The image capturing power supply flexible board 112 further has a bending portion 112b that can be bent 180° from the first end portion 112a with a predetermined bending diameter and a surplus portion 112c that forms a portion from the bending portion 112b to a fixing portion 112d for fixing the image capturing power supply flexible board 112 to the drive mechanism 113.

A second end portion 112e ahead of the fixing portion 112d is connected to the main board 107.

With this configuration, it is assumed that the movable unit 114 of the image capturing element unit 106 is driven for hand shake correction.

Even so, the bending portion 112b and the surplus portion 112c absorb deformation of the image capturing power supply flexible board 112 and reduce an effect of tension of the image capturing power supply flexible board 112 on control of the movable unit 114.

In addition, the bending portion 112b of the image capturing power supply flexible board 112 is formed at a portion extending from the first end portion 112a in a direction opposite to the heat dissipation fan 130.

Thus, as illustrated in the A-A cross-sectional view in FIG. 5A, a space sandwiched between the image capturing board 115a and the surplus portion 112c of the image capturing power supply flexible board 112 is formed in an area of the image capturing board 115a near the heat dissipation fan 130 up to the bending portion 112b.

Further, the image capturing power supply flexible board 112 is arranged to be at least partly included in an area in the blowing direction 131a of the heat dissipation fan 130 even if the movable unit 114 moves as illustrated in FIG. 5C.

With this configuration, even if the movable unit 114 moves, a gap can be formed between the image capturing power supply flexible board 112 and the image capturing board 115a in the area near the exhaust opening 131 on the image capturing board 115a, and ventilation resistance of the airflow from the heat dissipation fan 130 can be reduced.

Accordingly, it is possible to prevent the image capturing power supply flexible board 112 from hindering the airflow and making it difficult for the air on the image capturing board 115a to move.

As illustrated in FIG. 5C, a horizontal direction and a vertical direction viewed from the rear side of the digital camera 100, respectively, are defined as the X direction and the Y direction.

At that time, the three magnets 118 provided in the drive mechanism 113 are divided into a rectangular X direction magnet 118a and rectangular Y direction magnets 118b and 118c based on the respective directions in which the driving force is generated.

The Y direction magnet 118b is arranged closer to the X direction magnet 118a than the Y direction magnet 118c.

In a case where the image capturing element unit 106 is viewed from the rear side of the digital camera 100 in the optical axis direction, an area that is sandwiched between a center 115c of the image capturing element 115 and the X direction magnet 118a and between the center 115c of the image capturing element 115 and the Y direction magnet 118b is defined as an area 140.

The bending portion 112b of the image capturing power supply flexible board 112 is formed to be arranged in the area 140.

With this configuration, an inner peripheral surface of the bending portion 112b receives a force from the airflow of the heat dissipation fan 130 near a place where the magnetic force for driving the movable unit 114 is generated, and thus it is possible to reduce an effect of disturbance that the movable unit 114 receives from the airflow.

In other words, it is possible to reduce a current to be applied to the coil unit 116 in order to cancel rotation moment to the movable unit 114 generated by the force received by the image capturing power supply flexible board 112 from the airflow.

In addition, it is possible to maintain controllability of the movable unit 114 compared with a case where the heat dissipation fan 130 is not driven.

The image capturing signal flexible board 111 and the image capturing power supply flexible board 112 are arranged in the longitudinal direction of the image capturing element 115.

Figure 7A:
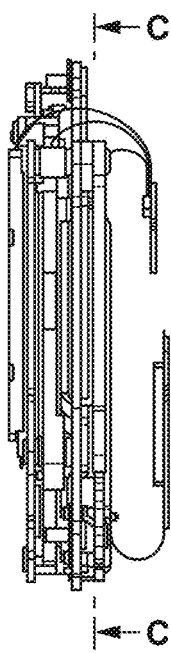
FIG. 7A is a side view of the image capturing element unit according to the first exemplary embodiment of the present disclosure.

A feature of the bending portion 112b is described with reference to FIGS. 7A and 7B. FIG. 7A illustrates the image capturing element unit 106 viewed from the horizontal direction of the digital camera 100.

Figure 7B:
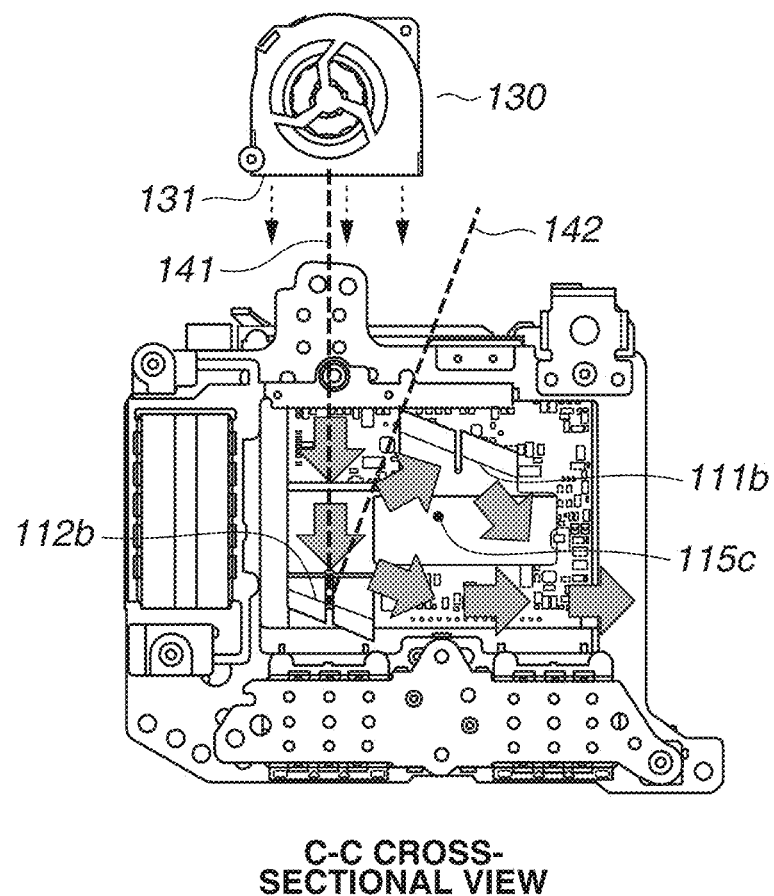
FIG. 7B is a schematic view of a path for an airflow generated by the heat dissipation fan according to the first exemplary embodiment of the present disclosure.

FIG. 7B is a C-C cross-sectional view taken along a line C-C in FIG. 7A.

The bending portion 112b is formed so that a line segment 141 connecting the center of the exhaust opening 131 of the heat dissipation fan 130 and the center of the bending portion 112b does not match a normal line 142 of an inner surface (an inner peripheral surface) of the bending portion 112b.

At that time, the normal line 142 of the inner surface (the inner peripheral surface) of the bending portion 112b is inclined toward the center 115c of the image capturing element 115 with respect to the line segment 141.

More specifically, the bending portion 112b is formed to guide the airflow from the heat dissipation fan 130 in a direction toward the center 115c of the image capturing element 115 and to prevent the airflow from escaping in a direction toward the X direction magnet 118a.

If the airflow escapes in the direction toward the X direction magnet 118a, the airflow does not sufficiently spread over a wider range on the image capturing board 115a, and the heat dissipation effect is impaired. However, the configuration of the present exemplary embodiment works towards preventing such an issue.

(Development View of Image Capturing Power Supply Flexible Board 112)

Figure 6A:
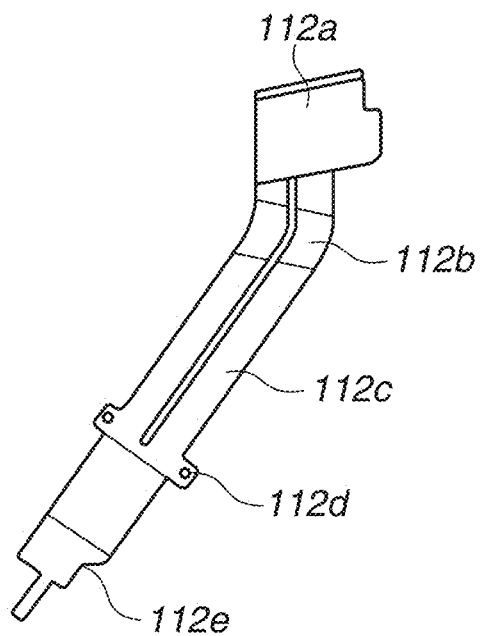
FIGS. 6A and 6B are respective development views of an image capturing power supply flexible board and an image capturing signal flexible board according to the first exemplary embodiment of the present disclosure.

FIG. 6A illustrates a developed image capturing power supply flexible board 112, and the first end portion 112a and the surplus portion 112c are formed at a certain angle so as not to be on a straight line across the bending portion 112b.

With this configuration, in a case where the bending portion 112b is formed so that the line segment 141 and the normal line 142 do not match with each other, the image capturing power supply flexible board 112 can be accommodated within a small projection area viewed from the optical axis direction of the digital camera 100 as illustrated in FIG. 5C, and space efficiency is good.

The image capturing signal flexible board 111 has a bending configuration similar to that of the image capturing power supply flexible board 112 so that its tension does not affect the control of the movable unit 114 as possible.

However, as illustrated in FIG. 4, the image capturing signal flexible board 111 is oriented 180° opposite to the image capturing power supply flexible board 112.

Further, a gap between a surplus portion 111c of the image capturing signal flexible board 111 and the image capturing board 115a is set wider than the gap between the surplus portion 112c of the image capturing power supply flexible board 112 and the image capturing board 115a and is configured to reduce the ventilation resistance.

A bending portion 111b of the image capturing signal flexible board 111 is formed in a direction facing the bending portion 112b of the image capturing power supply flexible board 112.

Figure 6B:
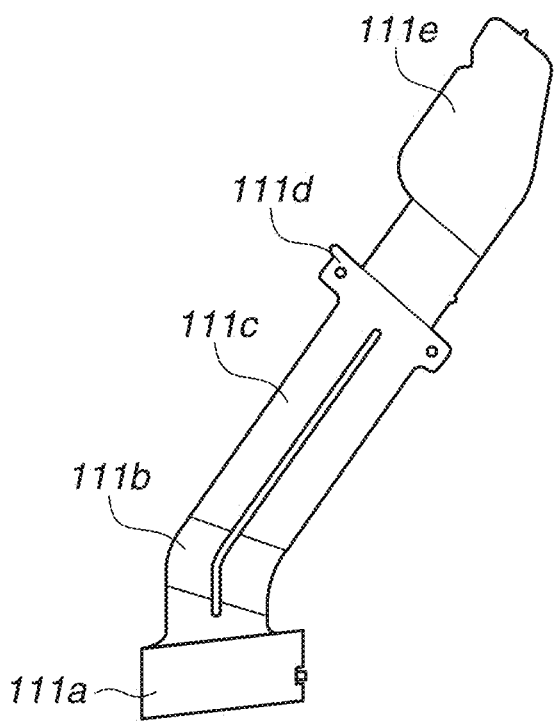

FIG. 6B illustrates a developed image capturing signal flexible board 111, and a first end portion 111a and the surplus portion 111c are formed at a certain angle across the bending portion 111b.

(Movement of Airflow Generated by Heat Dissipation Fan 130)

Movement of the airflow generated by the heat dissipation fan 130 is described step by step with reference to FIGS. 7A and 7B.

As indicated by arrows in FIG. 7B, the airflow from the heat dissipation fan 130 is exhausted from the exhaust opening 131.

Then, the airflow passes through a space sandwiched between the image capturing board 115a and the surplus portion 112c and a space sandwiched between the first end portion 112a and the surplus portion 112c and reaches the inner periphery side of the bending portion 112b.

At that time, the air on the image capturing board 115a, to which heat is transferred from the image capturing board 115a, is moved along the arrows in FIG. 7B by the airflow from the heat dissipation fan 130.

A direction of the airflow reaching the bending portion 112b is bent toward the center 115c of the image capturing element 115, and the airflow is guided to the space sandwiched between the surplus portion 111c of the image capturing signal flexible board 111 and the image capturing board 115a.

A part of the airflow reaches the bending portion 111b of the image capturing signal flexible board 111, applies a force thereto, and partially cancels out the rotation moment applied to the movable unit 114 by the airflow at the bending portion 112b.

The other part of the airflow passes through in the horizontal direction in FIG. 7B viewed from the optical axis direction, moves and diffuses the heated air on the image capturing board 115a into the digital camera 100.

The bending portion 112b of the image capturing power supply flexible board 112 and the bending portion 111b of the image capturing signal flexible board 111 are configured as described above.

Accordingly, the airflow from the heat dissipation fan 130 can be guided over the wide range on the image capturing board 115a and efficiently suppress a temperature rise of the image capturing element 115.

In addition, the heat dissipation fan 130 itself is not physically connected to the movable unit 114 and thus can produce the heat dissipation effect without impairing the hand shake correction function by the movement.

According to the first exemplary embodiment, for example, the heat dissipation fan 130 is in a state of operating at a wind speed of 4.5 L/min.

A "liter per minute" (L/min) is a unit of a volumetric flow rate. The heat dissipation fan 130 is incorporated, and thus the maximum achievable temperature of the image capturing element unit 106 can be lowered by 10° C.

Accordingly, the temperature rise of the heat generating source is suppressed, and the digital camera 100 is less likely to reach a limit temperature at which it stops functioning due to heat generation.

The features of the present exemplary embodiment will be described below.

The image capturing apparatus includes the image capturing element 115 that can move within the movable range in a direction different from the optical axis direction, the first circuit board 115a on which the image capturing element 115 is mounted, and the second circuit board 107 facing the first circuit board 115a.

The image capturing apparatus further includes the first flexible board 112 that electrically connects the first circuit board 115a and the second circuit board 107 and the heat dissipation fan 130.

The first flexible board 112 is bent in an area overlapping the movable range of the image capturing element 115 in the optical axis direction.

If viewed from a direction orthogonal to the optical axis, an orientation of the exhaust opening 131 of the heat dissipation fan 130 is arranged toward an inner surface of the bending portion 112b of the first flexible board 112 closest to the first circuit board 115a at a center position of the movable range of the image capturing element 115.

The next feature is that there is always an airflow path even at a mechanical end.

If viewed from the direction orthogonal to the optical axis, the inner surface of the bending portion 112b of the first flexible board 112 closest to the first circuit board 115a is always at least partly arranged in an area extending in the blowing direction 131a of the exhaust opening 131 of the heat dissipation fan 130 in a case where the image capturing element 115 moves in the movable range.

The next feature is that the bending portion does not form an orthogonal angle.

If viewed from the optical axis direction, in a case where a line segment connecting the center of the exhaust opening 131 and the center of the inner surface of the closest bending portion is defined, the line segment does not match the normal line of the inner surface of the bending portion.

The next feature is that the airflow does not blow on the magnets 118.

If viewed from the optical axis direction, the normal line of the inner surface of the bending portion 112b of the first flexible board 112 closest to the first circuit board 115a is inclined toward the center 115c of the image capturing element 115 from the line segment.

The next feature is that a bending angle is not orthogonal if the flexible board is developed.

If viewed from the optical axis direction, in a case where the first flexible board 112 is developed, the first flexible board 112 is formed with an angle with which the first flexible board is not on a straight line at the bending portion closest to the first circuit board 115a.

The next feature is that the image capturing apparatus is less affected by the rotation moment (it receives the airflow at a location where the effect of the rotation moment is reduced).

The image capturing apparatus includes a first magnet for driving the image capturing element 115 in a first direction among directions different from the optical axis direction and a second magnet for driving the image capturing element 115 in a second direction different from the first direction among the directions different from the optical axis direction.

Further, if viewed from the optical axis direction, the bending portion 112b of the first flexible board 112 is arranged in an area that is sandwiched between the center 115c of the image capturing element 115 and the first magnet and is sandwiched between the center 115c of the image capturing element 115 and the second magnet.

The next feature is that the image capturing apparatus cancels out the effect of the rotation moment, and the inner surfaces of the bending portions face each other.

The image capturing apparatus includes the second flexible board 111 that electrically connects the first circuit board 115a and the second circuit board 107.

The second flexible board 111 is bent in the area overlapping the movable range of the image capturing element 115 in the optical axis direction.

Further, the inner surface of the bending portion 111b of the second flexible board 111 closest to the first circuit board 115a is formed to face the inner surface of the bending portion 112b of the first flexible board 112 closest to the first circuit board 115a.

The next feature is that the blowing direction is the longitudinal direction of the image capturing element 115, and a bending direction is the transverse direction of the image capturing element 115.

The next feature is that the first flexible board 112 is made of a flexible board or a graphite sheet.

A second exemplary embodiment of the present disclosure is described with reference to FIGS. 8A, 8B, and 9A to 9C. For the sake of simplicity, descriptions of parts overlapping with the first exemplary embodiment are omitted, and only different parts are described.

Figure 8A:
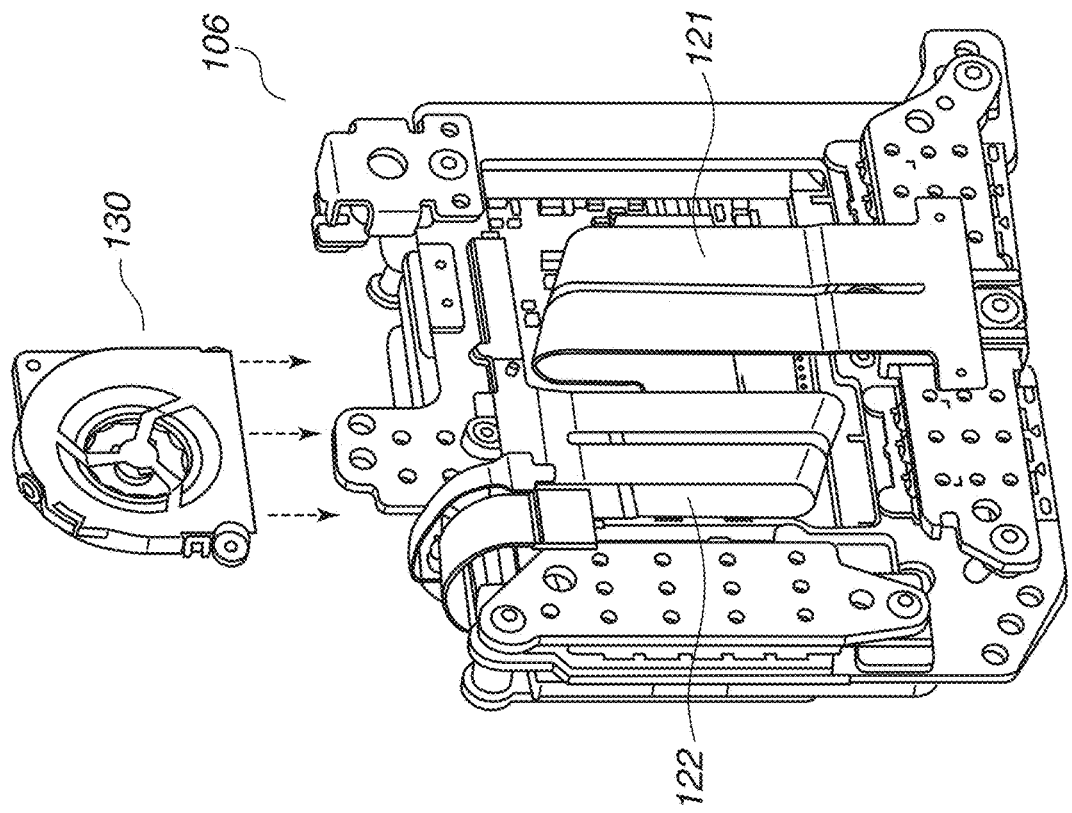
FIGS. 8A and 8B are rear perspective views of an image capturing element unit and a heat dissipation fan according to a second exemplary embodiment of the present disclosure.
Figure 8B:
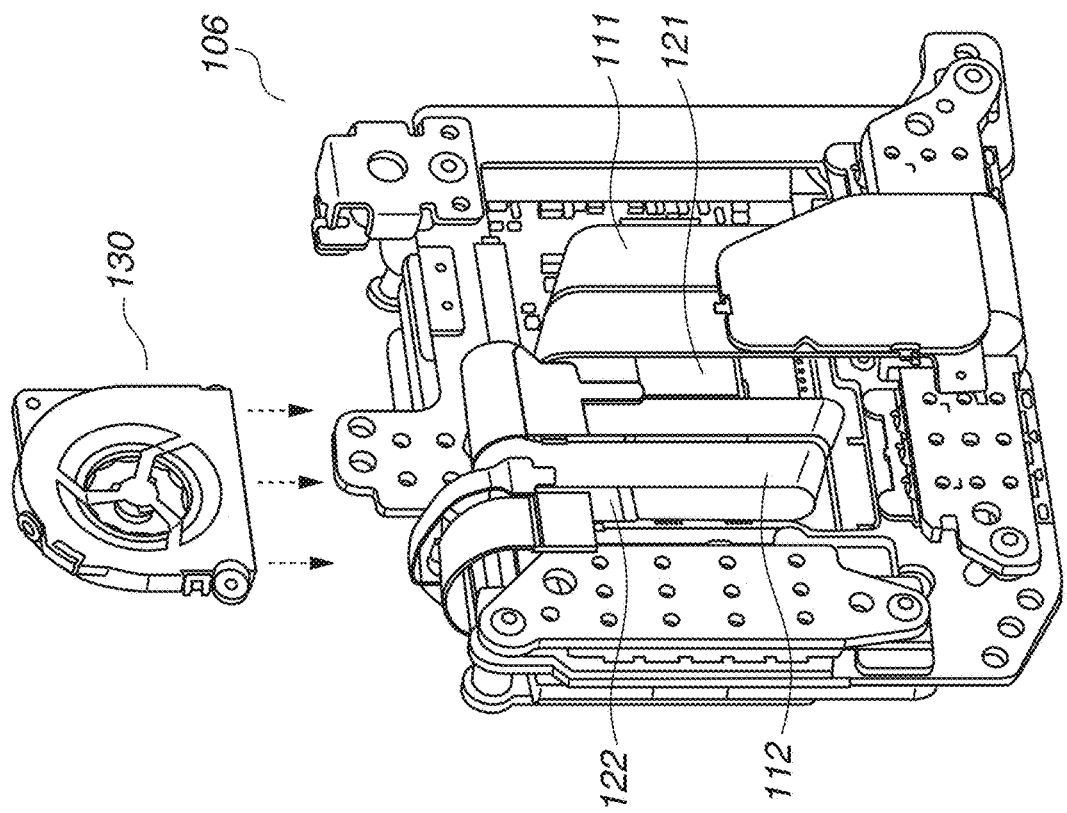

FIG. 8A illustrates the image capturing element unit 106 and the heat dissipation fan 130 viewed obliquely from the rear side of the digital camera 100. FIG. 8B is a diagram in which the image capturing signal flexible board 111 and the image capturing power supply flexible board 112 are hidden from FIG. 8A for ease of viewing the drawing.

As illustrated in FIGS. 8A and 8B, the image capturing element unit 106 is provided with graphite sheets 121 and 122 to be fixed to the movable unit 114 and the drive mechanism 113 so as to overlap with the image capturing power supply flexible board 112 and the image capturing signal flexible board 111.

The graphite sheets 121 and 122 function as a heat dissipation member that transmits heat generated in the movable unit 114 to the drive mechanism 113 and that has flexibility which does not easily affect the controllability of the movable unit 114.

FIG. 9C is a rear view of the image capturing element unit 106, and FIGS. 9A and 9B, respectively, are an A-A cross-sectional view and a B-B cross-sectional view of FIG. 9C.

As illustrated in FIG. 9A, the graphite sheet 122 has a first end portion 122a that is mounted to be in contact with the element 115b on the image capturing board 115a and is arranged in a substantially parallel direction to the image capturing board 115a therefrom.

The graphite sheet 122 further has a bending portion 122b that is bent 180° from the first end portion 122a with a predetermined bending diameter and a surplus portion 122c that forms a portion from the bending portion 122b to a fixing portion 122d for fixing the graphite sheet 122 to the drive mechanism 113.

With this configuration, it is assumed that the movable unit 114 of the image capturing element unit 106 is driven for the hand shake correction.

Even so, the bending portion 122b and the surplus portion 122c absorb deformation of the graphite sheet 122 and reduce an effect of tension of the graphite sheet 122 on the control of the movable unit 114.

In addition, the bending portion 122b of the graphite sheet 122 is formed at a portion extending from the first end portion 122a in the direction opposite to the heat dissipation fan 130.

Thus, as illustrated in the A-A cross-sectional view in FIG. 9A, a space sandwiched between the image capturing board 115a and the surplus portion 122c of the graphite sheet 122 is formed in an area of the image capturing board 115a near the heat dissipation fan 130 up to the bending portion 122b.

As illustrated in FIG. 9A, the image capturing power supply flexible board 112 is arranged so that the inner surface of the bending portion 112b of the image capturing power supply flexible board 112 faces an outer surface of the bending portion 122b of the graphite sheet 122.

The graphite sheet 121 has a bending configuration similar to that of the graphite sheet 122 so that its tension does not affect the control of the movable unit 114 as possible.

However, as illustrated in FIG. 8B, the graphite sheet 121 is oriented 180° opposite to the graphite sheet 122.

As illustrated in FIG. 9B, the image capturing signal flexible board 111 is arranged so that the inner surface of the bending portion 111b of the image capturing signal flexible board 111 faces an outer surface of a bending portion 121b of the graphite sheet 121.

With this arrangement, fixing portions 121d and 122d of the graphite sheets 121 and 122 do not sandwich the image capturing signal flexible board 111 or the image capturing power supply flexible board 112.

The fixing portions 121d and 122d of the graphite sheets 121 and 122 can be directly brought into contact with and fixed to the drive mechanism 113 and thus are desirable to the heat dissipation performance from the movable unit 114 to the drive mechanism 113.

In addition, the configurations of the bending portions 121b and 122b of the graphite sheets 121 and 122 can be replaced with the bending portions 111b and 112b of the image capturing signal flexible board 111 and the image capturing power supply flexible board 112 according to the first exemplary embodiment.

Accordingly, it is clear that the second exemplary embodiment can obtain an effect similar to that of the first exemplary embodiment.

(Block Diagram Illustrating Configuration Example of Digital Camera 400)

Figure 10:
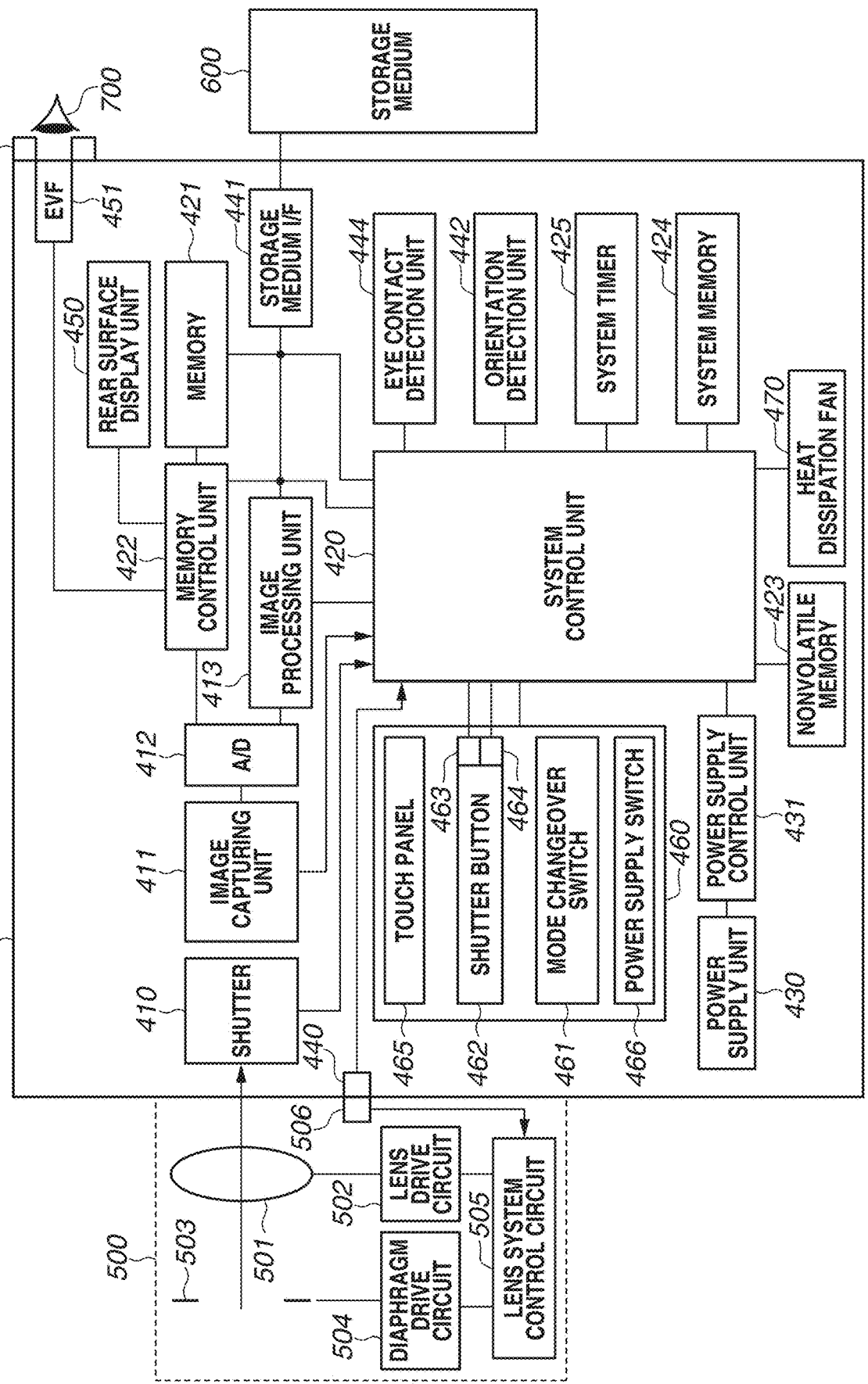
FIG. 10 is a block diagram according to the present disclosure.

FIG. 10 is a block diagram illustrating a configuration example of a digital camera 400 according to the present disclosure.

A shutter 410 is a focal-plane shutter that can freely control an exposure time of an image capturing unit 411 described below.

The control of the shutter 410 is performed by a system control unit 420 described below.

The image capturing unit 411 is an image capturing device that has an imaging plane on which an object image (an optical image) passing through a lens 501 is formed and outputs an electrical signal (an analog signal) corresponding to the optical image on the imaging plane by photoelectric conversion.

As the image capturing unit 411, a charge couple device (CCD) sensor or a complementary metal oxide semiconductor (CMOS) sensor is used.

An analog-to-digital (A/D) converter 412 is a signal conversion unit that is used to convert an analog signal output from the image capturing unit 411 into a digital signal.

An image processing unit 413 is an image calculation unit that generates image data by performing predetermined pixel interpolation, resizing processing such as reduction, and color conversion processing on the digital signal from the A/D converter 412 or the digital signal from a memory control unit 422 described below.

The system control unit 420 controls a diaphragm position and a lens position based on a calculation result obtained from the image processing unit 413.

The image processing unit 413 further performs calculation processing using the above-described image data and performs through the lens (TTL) type automatic white balance (AWB) processing based on the obtained calculation result.

The system control unit 420 is a control unit that includes at least one processor or circuit and controls the entire digital camera 400.

The system control unit 420 executes a program stored in a nonvolatile memory 423, which is described below, and thus realizes each process according to the present disclosure.

A memory 421 is a storage unit that temporarily stores the digital signal obtained by the image capturing unit 411 and converted by the A/D converter 412 and the image data generated by the above-descried image processing unit 413.

The memory 421 has a storage capacity sufficient to store a predetermined number of still images, moving images of a predetermined time length, and sound.

The memory control unit 422 is a memory control unit that controls transmission and reception of data controlled by the system control unit 420 to and from the A/D converter 412, the image processing unit 413, and the memory 421.

The digital signal output from the A/D converter 412 is directly written to the memory 421 via the image processing unit 413 and the memory control unit 422 or only via the memory control unit 422.

The nonvolatile memory 423 is an electrically erasable/recordable read-only storage unit and stores a constant, a program, and the like for an operation of the system control unit 420.

A system memory 424 is a readable and writable storage unit that stores a constant and a variable for the operation of the system control unit 420, a program read from the nonvolatile memory 423, and the like.

A system timer 425 is a time measurement unit that measures a time until auto power off for turning off various display members, which are described below, is executed and an exposure time.

The auto power off has a function of turning off the various display members, which are described below, in order to prevent battery consumption in a case where it is determined that a photographer does not operate the digital camera 400.

A power supply unit 430 includes a primary battery such as an alkaline battery or a lithium battery, a secondary battery such as a nickel-cadmium (NiCd) battery, a nickel-metal hydride (NiMH) battery, or a lithium ion (Li) battery, and an alternate current (AC) adapter.

A power supply control unit 431 includes a circuit for detecting the power supply unit 430, which is the power supply for driving the digital camera 400, a direct current to direct current (DC-DC) converter, and a switch circuit for switching a power supply destination.

The power supply unit 430 detects whether the battery is installed, a type of the battery, and a battery remaining amount.

Further, the power supply control unit 431 controls the DC-DC converter based on the detection result and an instruction from the system control unit 420 and supplies a required voltage to the supply destination at a required timing.

A communication terminal 440 is provided in the digital camera 400 and is electrically connected to a lens communication terminal 506 described below.

The communication terminal 440 is electrically connected, and thus the system control unit 420 that controls the entire digital camera 400 can communicate with a lens unit 500 described below.

A storage medium interface (I/F) 441 is an interface with a storage medium 600 described below.

An orientation detection unit 442 detects an orientation of the digital camera 400 with respect to the direction of gravity.

The orientation detection unit 442 can output orientation information as to whether an image captured by the image capturing unit 411 is an image captured with the digital camera 400 horizontally held or an image captured with the digital camera 400 vertically held based on the detected orientation.

The system control unit 420 can add the orientation information output from the orientation detection unit 442 to the image data.

As the orientation detection unit 442, an acceleration sensor, a gyro sensor, or the like can be used.

In a case where the acceleration sensor and the gyro sensor are used as the orientation detection unit 442, the orientation detection unit 442 can also detect movement of the digital camera 400 (pan, tilt, lift, whether it is stationary, and the like).

An eyepiece unit 443 is a portion where an eye (object) 700 of a photographer approaches (contacts) the digital camera 400.

An eye contact detection unit 444 is an approach or eye contact detection sensor that detects approach (eye contact) and separation (eye separation) of the eye 700 to and from the eyepiece unit 443.

The eye contact detection unit 444 detects the contact of the eye 700 with the eyepiece unit 443 depending on whether a light-receiving portion (not illustrated) of an infrared proximity sensor receives light.

After the eye contact is detected, the system control unit 420 determines that the eyepiece unit 443 is in an eye contact state until the eye separation is detected.

After the eye separation is detected, the system control unit 420 determines that the eyepiece unit 443 is in a non-eye contact state until the eye contact is detected.

The infrared proximity sensor is an example, and another sensor can be adopted to the eye contact detection unit 444 as long as the sensor can detect approach of an eye or an object that can be regarded as an eye contact.

The above-described memory 421 also serves as a memory (a video memory) for image display.

The digital signal and the image data written to the memory 421 are displayed by a rear surface display unit 450 and an electronic viewfinder (EVF) 451 via the memory control unit 422.

The rear surface display unit 450 performs display corresponding to the signal from the memory control unit 422.

In a case where the eye contact detection unit 444 detects the eye contact, the EVF 451 performs display corresponding to the signal from the memory control unit 422.

The digital signal that is obtained by performing A/D conversion on the analog signal generated in the image capturing unit 411 by the A/D converter 412 and stored in the memory 421 is sequentially transmitted to the rear surface display unit 450 or the EVF 451 and displayed thereon.

Accordingly, live-view imaging display, which is real-time display, can be performed.

The system control unit 420 switches display (a display state)/non-display (a non-display state) of the rear surface display unit 450 and the EVF 451 in response to the state detected by the above-described eye contact detection unit 444.

During the non-eye contact state, the rear surface display unit 450 performs display, and the EVF 451 is brought into the non-display state.

Further, during the eye contact state, the EVF 451 performs display, and the rear surface display unit 450 is brought into the non-display state.

An operation unit 460 includes various operation members as input units for receiving an operation from a user.

The operation unit 460 includes the various operation members (a mode changeover switch 461, a shutter button 462, a first shutter switch 463, a second shutter switch 464, a touch panel 465, and a power supply switch 466), which are described below.

Further, the operation unit 460 is an operation unit for inputting various operation instructions to the system control unit 420.

The mode changeover switch 461 switches an operation mode of the system control unit 420 to any of a still image capturing mode, a moving image capturing mode, and the like.

Image capturing modes included in the still image capturing mode are an auto image capturing mode, an auto scene determination mode, and a manual image capturing mode.

The still image capturing mode further includes an aperture priority (Av) mode (Av mode), a shutter speed priority mode (Time-value (Tv) mode or Tv mode), and a program automatic exposure (AE) mode (P mode) as the image capturing modes.

Similarly, the moving image capturing mode may include a plurality of image capturing modes.

The shutter button 462 is a button for a photographer to issue an image capturing preparation instruction and an image capturing instruction.

The first shutter switch 463 is turned ON in the middle of an operation, namely half-pressing (the image capturing preparation instruction) of the shutter button 462 provided to the digital camera 400 and generates a first shutter switch signal SW1.

An image capturing preparation operation such as autofocus (AF) processing, AE processing, and AWB processing is started by the first shutter switch signal SW1.

The second shutter switch 464 is turned ON by completion of the operation, namely full pressing (the image capturing instruction) of the shutter button 462 and generates a second shutter switch signal SW2.

The system control unit 420 executes reading of the analog signal from the image capturing unit 411 and signal conversion processing by the A/D converter 412 and the image processing unit 413 by the second shutter switch signal SW2.

Further, the system control unit 420 starts an image capturing processing operation up to writing the image data temporarily stored in the memory 421 to the storage medium 600 described below.

The touch panel 465 is a device for detecting a touch or drag operation by a photographer.

The touch panel 465 is integrated with the rear surface display unit 450, and an operation can be performed by touching the display unit of the rear surface display unit 450 with a finger.

The power supply switch 466 is a switch for switching ON/OFF of the power supply. The power supply control unit 431 controls the power supply from the power supply unit 430 by a switching operation on the power supply switch 466.

A heat dissipation fan 470 is controlled by the system control unit 420 and cools the heat generating source inside the digital camera 400.

The lens unit 500 is an interchangeable lens that can be attached to and detached from the digital camera 400.

The lens 501 is a lens group for generating an optical image (an object image) from object light reflected by an object and includes a plurality of lenses, but one lens is illustrated in FIG. 10 for the sake of simplicity.

The lens communication terminal 506 is a communication terminal for the lens unit 500 to communicate with the digital camera 400.

The lens communication terminal 506 is electrically connected to the communication terminal 440 as described above, and thus the lens unit 500 can communicate with the system control unit 420 that controls the entire digital camera 400.

Accordingly, the system control unit 420 can communicate with a lens system control circuit 505 and a diaphragm drive circuit 504 and control a position of a diaphragm 503 and a focus state of a real image obtained by shifting the lens 501.

The storage medium 600 is a storage medium such as a memory card that can be attached to and detached from the digital camera 400 and store a captured image.

The storage medium 600 includes, for example, a secure digital (SD) card, a memory that retains data in the absence of a power supply such as a FLASH® memory, and a hard disk.

INDUSTRIAL APPLICABILITY

The technique according to the present disclosure is applied to an electronic device and an image capturing system.

According to an aspect of the present invention, it is possible to prevent an airflow from an airflow generation unit from being hindered by a flexible board and heat dissipation performance of an image capturing element from being reduced.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-191535, filed Nov. 25, 2021, which is hereby incorporated by reference herein in its entirety.

What is claimed is:

1. An image capturing apparatus comprising:
an image capturing element configured to move within a movable range in a direction different from an optical axis direction;
a first circuit board configured to mount the image capturing element on the first circuit board;
a second circuit board configured to face the first circuit board;
a first flexible board configured to electrically connect the first circuit board and the second circuit board; and
a fan,
wherein the first flexible board is bent in an area that overlaps with the movable range of the image capturing element in the optical axis direction, and
wherein, in a case of being viewed from a direction orthogonal to an optical axis, an orientation of an exhaust opening of the fan is arranged toward an inner surface of a bending portion of the first flexible board closest to the first circuit board at a center position of the movable range of the image capturing element.

2. The image capturing apparatus according to claim 1, wherein, in a case of being viewed from the direction orthogonal to the optical axis where the image capturing element moves within the movable range, the inner surface of the bending portion of the first flexible board closest to the first circuit board is always at least partly arranged in an area extending in a blowing direction of the exhaust opening of the fan.

3. The image capturing apparatus according to claim 2, wherein the blowing direction is a longitudinal direction of the image capturing element, and a bending direction is a transverse direction of the image capturing element.

4. The image capturing apparatus according to claim 1, wherein, in a case of being viewed from the optical axis direction with a line segment defined to connect a center of the exhaust opening and a center of the inner surface of the closest bending portion, the line segment does not match a normal line of the inner surface of the closest bending portion.

5. The image capturing apparatus according to claim 4, wherein, in the case of being viewed from the optical axis direction, the normal line is inclined toward a center side of the image capturing element from the line segment.

6. The image capturing apparatus according to claim 4, wherein, in the case of being viewed from the optical axis direction, if the first flexible board is developed, the first flexible board is formed with an angle with which the first flexible board is not on a straight line at the bending portion closest to the first circuit board.

7. The image capturing apparatus according to claim 1, further comprising:
a first magnet configured to drive the image capturing element in a first direction among directions different from the optical axis direction; and
a second magnet configured to drive the image capturing element in a second direction different from the first direction among the directions different from the optical axis direction,
wherein, in a case of being viewed from the optical axis direction, the bending portion of the first flexible board is arranged in an area that is sandwiched between a center of the image capturing element and the first magnet and is sandwiched between the center of the image capturing element and the second magnet.

8. The image capturing apparatus according to claim 1, further comprising a second flexible board configured to electrically connect the first circuit board and the second circuit board,
wherein the area is a first area and the second flexible board is bent in a second area that overlaps with the movable range of the image capturing element in the optical axis direction, and
wherein an inner surface of a bending portion of the second flexible board closest to the first circuit board is formed to face the inner surface of the bending portion of the first flexible board closest to the first circuit board.

9. The image capturing apparatus according to claim 1, wherein the first flexible board is made of a flexible board or a graphite sheet.

* * * * *